(12) United States Patent
Auric et al.

(10) Patent No.: US 6,229,398 B1
(45) Date of Patent: May 8, 2001

(54) INTERFACE DEVICE BETWEEN A BROAD-BAND ULTRAHIGH FREQUENCY OPTOELECTRONIC SENSOR AND A LOAD

(75) Inventors: Claude Auric, Chateaufort; Philippe Dueme, Orsay, both of (FR)

(73) Assignee: Thomson C&F Detexis, St. Cloud (FR)

( * ) Notice: Subject to any disclaimer, the term of this patent is extended or adjusted under 35 U.S.C. 154(b) by 0 days.

(21) Appl. No.: 09/392,734

(22) Filed: Sep. 9, 1999

(30) Foreign Application Priority Data

Sep. 11, 1998 (FR) .................................................. 98 11364

(51) Int. Cl.[7] ....................................................... H03F 3/08
(52) U.S. Cl. ............................ 330/308; 330/53; 330/292; 250/214 A
(58) Field of Search ............................. 330/53, 286, 292, 330/308; 250/214 A

(56) References Cited

U.S. PATENT DOCUMENTS

| | | | | |
|---|---|---|---|---|
| 4,723,313 | * | 2/1988 | Folcke et al. ......................... | 455/619 |
| 5,216,386 | * | 6/1993 | Wyatt .................................... | 330/308 |
| 5,874,861 | * | 3/1999 | Nagase et al. ....................... | 330/308 |
| 5,880,640 | * | 3/1999 | Dueme ................................. | 330/303 |

FOREIGN PATENT DOCUMENTS

| | | |
|---|---|---|
| 0801466 | 10/1997 | (EP) . |
| 2727585 | 5/1996 | (FR) . |
| 2747523 | 10/1997 | (FR) . |

OTHER PUBLICATIONS

Freundorfer, Al P., et al., "Noise in Distributed MESFET Preamplifiers", IEEE Journal of Solid–State Circuits, vol. 31, No. 8, pp. 1100–1111, Aug. 1996.

* cited by examiner

*Primary Examiner*—Robert Pascal
*Assistant Examiner*—Henry Choe
(74) *Attorney, Agent, or Firm*—Connolly Bove Lodge & Hutz

(57) ABSTRACT

An interface device is disposed between an optoelectronic sensor and a load the impedance of which is lower than that of the sensor. The interface device comprises an impedance adaptation stage, comprising a distributed amplifier with a broad band of frequencies, the input of which is directly connected to a terminal of the sensor, and constitutes an impedance with an ohmic value which is greater than that of the load, and the output of which is connected to the load. The device additionally comprises a bootstrap which comprises a field-effect transistor mounted in a common drain, the gate of which is connected to a terminal of the sensor, and the source of which is connected to the other terminal of the sensor, via a capacitor with a selected value. The noise factor of an optical connection which uses the said sensor is reduced, whilst maintaining a high, flat level of gain in a very broad frequency band ranging from a few kHz to a few GHz, whereas the bootstrap can compensate for the undesirable effects of the parasitic capacitor of the sensor.

7 Claims, 2 Drawing Sheets

INTERFACE DEVICE BETWEEN A BROAD-BAND ULTRAHIGH FREQUENCY OPTOELECTRONIC SENSOR AND A LOAD

BACKGROUND OF THE INVENTION

The present invention relates to an interface device between a broad-band ultrahigh frequency (hyperfrequency or microwave) optoelectronic sensor and a load.

It applies in particular to the production of ultrahigh frequency monolithic integrated circuits, which are designed in particular for transmission of very broad-band ultrahigh frequency signals on optical fibres.

In general, optoelectronic sensors, such as photodiodes, act as a source of current which is controlled by modulation of the incident light, in which a parasitic capacitor C is mounted in parallel on a resistor with a very high value.

From the point of view of adaptation of impedance, the ideal load (which is also known as the reading resistance) to be submitted to this photodiode would be a resistance R with a high value. Since the cutoff frequency is proportional to the time constant RC, depending on the photodiode used, a load of this type, associated with the parasitic capacitor C, could give rise to a cutoff frequency which is much lower than the maximum frequency of use of the ultrahigh frequency optical connections.

A means for reducing the value of the time constant RC consists of decreasing the resistance R of the load. For example, it is known to decrease this resistance to a value lower than 50 ohms, by connecting the photodiode to an amplifier with a low input impedance. However, a solution of this type has the disadvantage that it decreases greatly the gain of an optical connection chain, and in some cases increases the noise factor, since the said noise factor is a decreasing function of the resistance R, the increase in the noise factor being all the most substantial, the lower the power which is incident on the photodiode.

In addition, in EP-A-801466, the applicant has proposed an assembly known as the bootstrap, in which the negative effects of the parasitic capacitor of the photodiode are compensated for by cancelling out the difference in potential at the terminals of the said parasitic capacitor. In practice, this bootstrap comprises a field-effect transistor mounted in a common drain, the gate of which is connected to one terminal of the sensor, and the source of which is connected to the other terminal of the sensor.

In addition, the bootstrap is completed by an impedance adaptation stage which comprises another transistor mounted in a common drain. The gate of the transistor of the adaptation stage is connected to the source of the transistor of the bootstrap, and the source of the transistor of the adaptation stage is applied to the standardised impedance load of 50 ohms.

An impedance adaptation stage of this type is not entirely satisfactory, in that the useful signal is recuperated in this case on the source resistance of the transistor of the bootstrap. In addition, a connection capacitor is interposed between the source of the transistor of the bootstrap and the gate of the impedance adaptation transistor, and an impact inductor is placed directly in parallel on the load.

As a result, amongst other disadvantages, there is a limitation of recuperation of the useful signal, towards the low frequencies.

SUMMARY OF THE INVENTION

The present invention provides a solution to this problem.

The invention relates to an interface device between a broad-band ultrahigh frequency optoelectronic sensor and a load, the impedance of which is lower than that of the sensor, the said interface device comprising an impedance adaptation stage.

According to a general definition of the invention, the adaptation stage comprises a distributed amplifier with a broad band of frequencies, the input of which is directly connected to a terminal of the sensor, and constitutes an impedance with an ohmic value which is greater than that of the load, and the output of which is connected to the load, the interface device additionally comprising a bootstrap which comprises a field-effect transistor mounted in a common drain, the gate of which is connected to one terminal of the sensor, and the source of which is connected to the other terminal of the sensor, via a capacitor with a selected value.

The high input impedance of the distributed amplifier according to the invention makes it possible to reduce the noise factor of an optical connection chain comprising an interface device of this type, whilst maintaining a high, flat level of gain in a very broad frequency band ranging from a few kHz to a few GHz, whereas the bootstrap according to the invention can compensate for the undesirable effects of the parasitic capacitor of the sensor towards the high frequencies, without any detrimental effects on the low frequencies.

In practice, the distributed amplifier comprises a plurality of amplifier cells, each of which is mounted between a gate line and a drain line, each cell comprising an active circuit which has at least one field-effect transistor mounted in a common source, and passive elements which constitute sections of the gate line and the drain line, one of the ends of the gate line being connected directly to one of the terminals of the sensor, and one of the ends of the drain line being connected to the load.

Preferably, the polarisation of the distributed amplifier according to the invention has saturable loads, which makes it possible to avoid the limitations towards the low frequencies.

Other characteristics and advantages of the invention will become apparent from the following detailed description and the drawings.

DETAILED DESCRIPTION OF THE PREFERRED EMBODIMENT

The attached drawings substantially comprise elements of a specific nature. They can thus not only assist in understanding the following detailed description, but can also contribute towards definition of the invention, as applicable.

Figure 1:
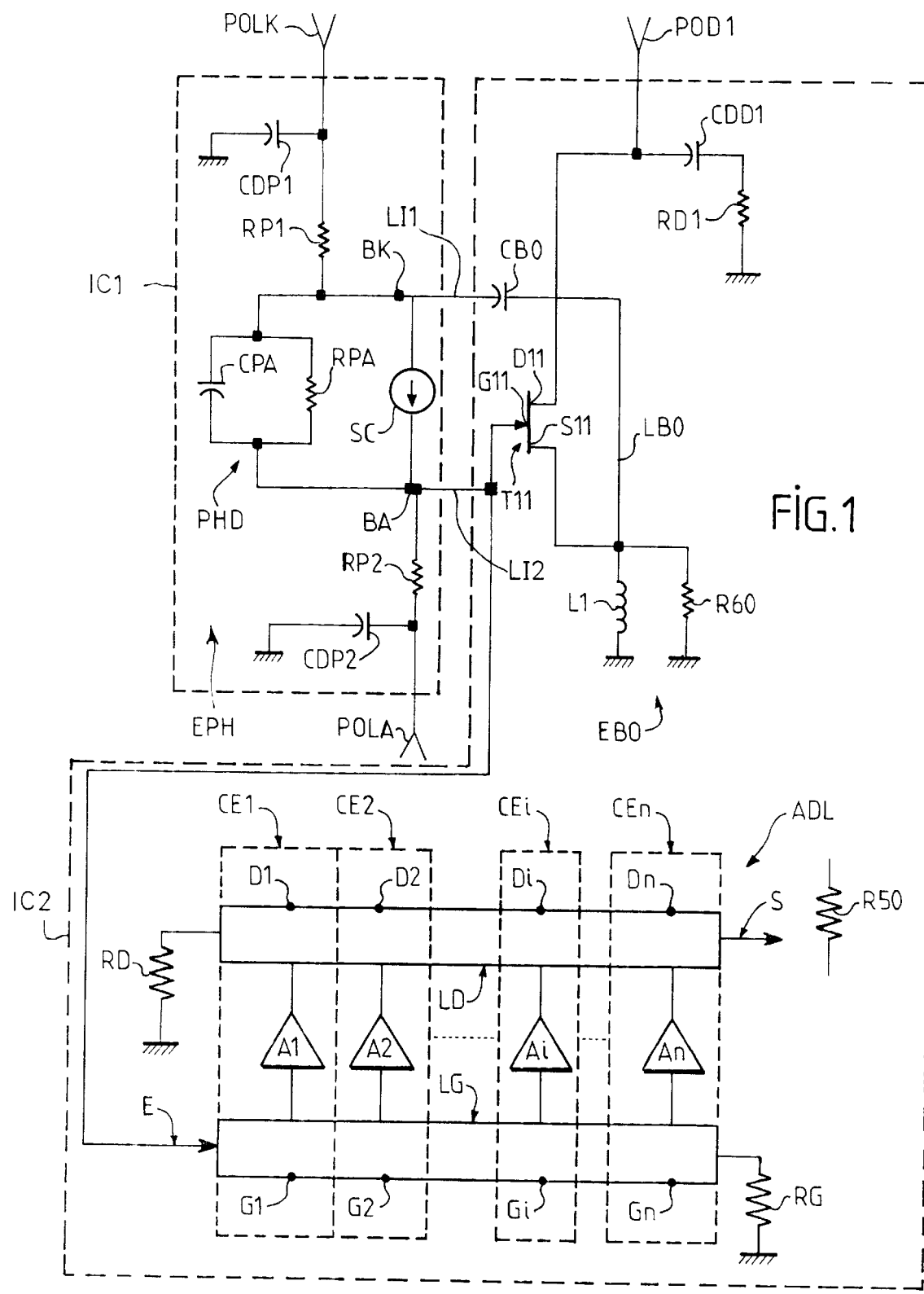
FIG. 1 is a functional diagram of the interface device between an ultrahigh frequency optoelectronic sensor with a broad band of frequencies and a load, the impedance of which is lower than that of the sensor according to the invention.

In FIG. 1, the diagram which equates to a photodiode PED, corresponds to a source of current SC, which comprises terminals BK and BA, between which a parasitic capacitor CPA and an impedance RPA with a very high level are mounted in parallel.

For example, depending on the cost of the photodiodes, the level of the parasitic capacitor varies from a relatively high value of approximately 0.7 pF, to a relatively low value of approximately 0.05 pF. The level of the impeder RPA is higher than 2000 ohms.

A direct polarisation voltage POLK is applied to the terminal (cathode) BK of the source of current SC via a polarisation resistor RP1, which is mounted in series. A capacitor CDP1 is provided in order to decouple the ultrahigh frequency signal. One of the armatures of the decoupling capacitor CDP1 is earthed, whereas the other armature is connected to a terminal of the resistor RP1.

Similarly, a direct polarisation voltage POLA is applied to the terminal (anode) BA of the source of current SC, via a polarisation resistor RP2. A capacitor CDP2 is also provided in order to decouple the ultrahigh frequency signal. One of the armatures of the capacitor CDP2 is connected to one of the terminals of the resistor RP2, whereas the other armature of the capacitor CDP2 is earthed.

The applicant has set out to solve the problem of providing an interface device, between the photodiode stage EPB and an impedance load which is lower than that of the photodiode, comprising an impedance adaptation stage, which can reduce the noise factor of an optical connection comprising a photodiode stage of this type.

The solution proposed according to the invention consists of providing the impedance adaptation stage with a distributed amplifier ADL with a broad frequency band and high input impedance, the input of which is connected directly to a terminal BA of the sensor. The input of this distributed amplifier then constitutes the useful load of the photodiode, which is also known as the "reading impedance".

In this case, "connected directly" means the fact that there is no connection capacitor between the photodiode stage and the impedance adaptation stage.

In fact, the applicant has perceived that it is possible to eliminate the connection capacitor between the photodiode stage and the adaptation stage, since the direct voltage which is necessary for polarisation of the amplifier, and, if applicable, for the transistor of the bootstrap which will be described in greater detail hereinafter, is a gate voltage.

In comparison with EP-A-801466, the absence of a connection capacitor between the photodiode stage and the impedance adaptation stage makes it possible to widen the band of recuperation of the useful signal towards the low frequencies.

In general, the distributed amplifier ADL comprises a plurality of amplifier cells A, which are individualised as A1 to An, each of which is mounted between a gate line LG and a drain line LD.

Each amplifier cell comprises an active circuit, which has a field-effect transistor mounted as a common source. Passive elements constitute sections of the gate line and of the drain line. The head of the gate line LG forms the input E of the distributed amplifier. The other end EX1 of the gate line is loaded on an end resistor RG, which is substantially equivalent to the characteristic impedance of the gate line. Conversely, one end EX2 of the drain line is loaded on a end resistor RD, which is substantially equivalent to the characteristic impedance of the drain line, whereas the other end of the drain line defines the output S of the distributed amplifier, which is designed to be connected to the load R50.

In practice, the input signal of the distributed amplifier is propagated on the gate line LG. Each amplifier structure, for example the structure A1, receives the input signal at its point G1, and supplies to point D1 of the drain line an amplified version of the input signal, which version is propagated on this drain line LD.

The lines LC and LD are not dispersive until they reach their cutoff frequency, thus providing a performance with a very broad band.

Advantageously, the values of the passive elements which are used to constitute the sections of the drain line and/or of the gate line of each cell are selected such that the characteristic impedance of each cell is smaller than that of the preceding cell, according to the direction of propagation of the ultrahigh frequency signals, and in accordance with a selected law, in order to bring the characteristic impedance of the drain line progressively to a selected value which permits high-impedance adaptation between the photodiode and the load, whilst maintaining gain which is flat and free from discontinuities, on the very broad band of frequency which ranges from a few KHz to a few GHz.

A structure of this type has the advantage that it provides broad-band impedance adaptation in a manner which is simple and easy to implement, without giving rise to any loss of power.

In addition, the ultrahigh frequency distributed amplifier with high input impedance, which is described with reference to FIG. 1, is used not only to provide the functions of amplification, but also to provide a function of adaptation of impedance, which makes it possible to obtain a flat, high gain, free from discontinuity, on a very broad frequency band.

Figure 2:
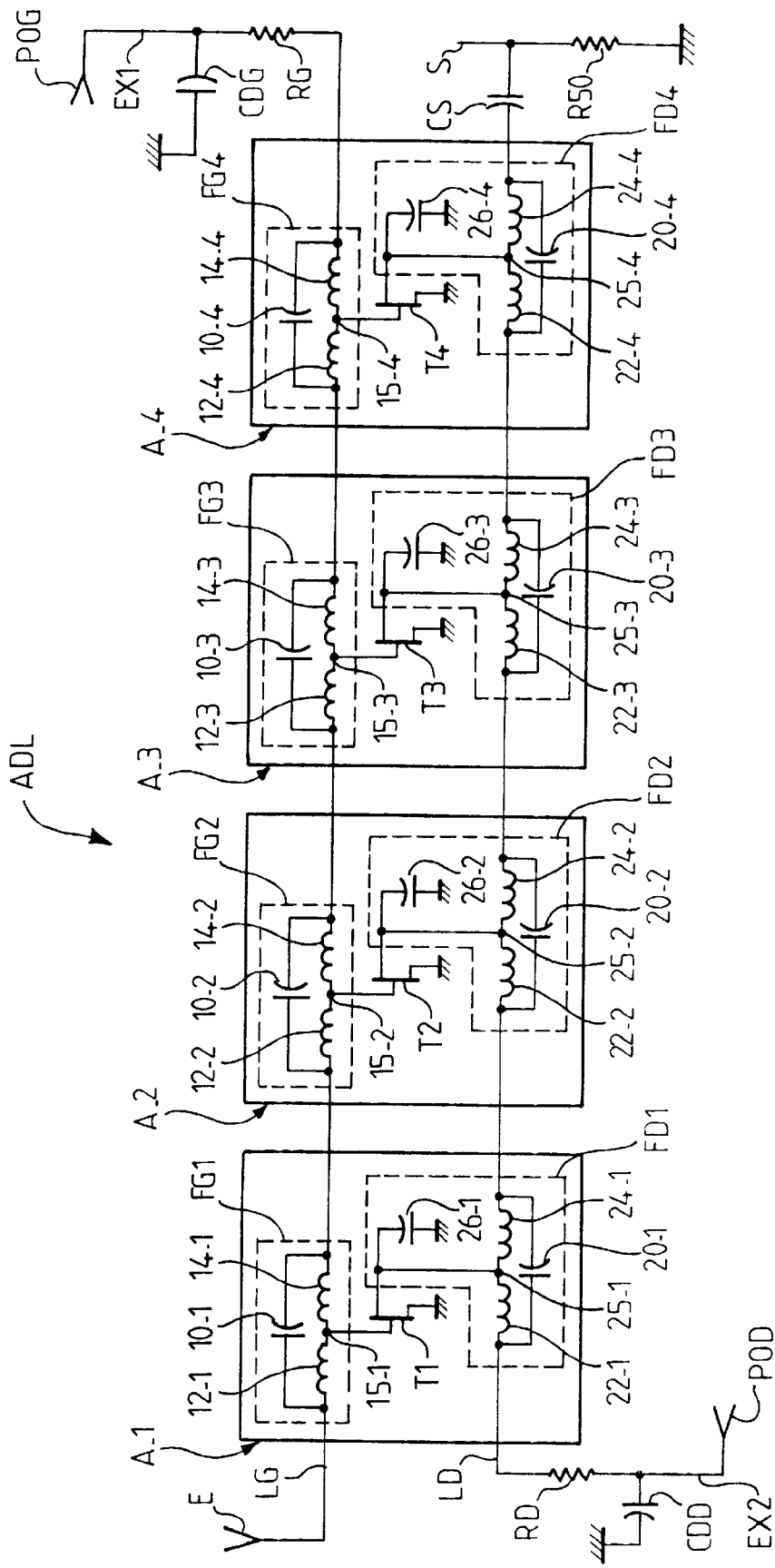
FIG. 2 is a detailed diagram of the distributed amplifier according to the invention, which provides the impedance adaptation.

With reference to FIG. 2, a polarisation voltage POG is applied to the end EX1 of the gate line LG, via the end resistor RG, with an ohmic value which represents the characteristic impedance of the gate line LG, for example of approximately 125 ohms. This voltage can optionally be used in order to polarise the gate of the transistor T11 the place of the voltage POLA which is described with reference to FIG. 1. In this case, the components RP2 and CDP2 are eliminated.

A polarisation voltage POD is applied to the end EX2 of the drain line LD, via the end resistor RD, with an ohmic value of approximately 50 ohms, for example.

A decoupling capacitor CDG, which is connected to earth, is mounted in parallel between the end resistor RG and the polarisation circuits which supply the voltage POG.

Similarly, a decoupling capacitor CDD, which is connected to earth, is mounted in parallel between the end resistor RD and the polarisation circuits which supply the voltage POD.

The passive elements which are used to constitute the sections of the gate line FG, for example FG1, in each cell, for example cell A1, comprise two inductors 12-1, 14-1 in series, and a capacitor 10-1, which is mounted in parallel on these two inductors 12-1 and 14-1. The two inductors can comprise a mutual inductor. In general, together with the gate/source capacitor of the transistor, a structure of this type is a filter of the all-pass type, which can be transformed into a low-pass filter if there is no particular constraint such as an output power.

Since the capacitor 10-1 has a very low value, it is not created physically. It is distributed in the inductors 12-1 and 14-1. The common point 15-1 of the two inductors 12-1 and 14-1 is consequently connected to the gate of the transistor T1. The value of the mutual inductance is in this case advantageously zero. The passive elements FG which are thus provided then simply constitute a filter of the low-pass type.

The passive elements which are used to constitute the sections of the FD drain line (for example FD1) of each cell (for example cell A1) comprise two inductors 22-1 and 24-1 in series, and a capacitor 20-1 which is mounted in parallel on these two inductors 22-1 and 24-1. The two inductors can comprise a mutual inductor. Together with the drain/source capacitor of the transistor, a structure of this type is a filter of the all-pass type.

Since the capacitor 20-1 has a low value, it is distributed in the inductors 22-1 and 24-1. The common point 25-1 of the two inductors 22-1 and 24-1 is consequently connected to the drain of the transistor T1. The value of the mutual inductance is in this case advantageously zero. Between the common point 25-1 of the drain and the earth, there is mounted a capacitor 26-1, which will be described in detail hereinafter. The passive elements FD which are thus provided then simply constitute a filter of the low-pass type.

Advantageously, by modifying the values of the passive elements FD and/or FG of a cell, relative to those of the following cell, and by selecting these values according to a specific law which will be described in detail hereinafter, impedance adaptation is obtained between the photodiode and the load, whilst retaining flatness of gain along the entire ultrahigh frequency band width.

According to a first embodiment described with reference to FIG. 2, only the values of the passive elements FD of each cell are different from one cell to the next, whereas the values of the passive elements FG are constant from one cell to the next.

According to a second embodiment (not shown), the values of the passive elements FG also vary from one cell to the next.

The signals which are propagated according to the two lines LG and LD must have their phases recombined in each cell. For example, the input impedance of the distributed amplifier is equivalent to 125 ohms, whereas the load impedance to which the output of the distributed amplifier is applied is 50 ohms. Thus, in order for the two lines LG and LD to have their impedance adapted, the ratio LGG/CGS must be substantially equivalent to the square of 125 ohms, whereas the ratio LDD/CD must be substantially equivalent to the square of 50 ohms, in which LGG=the sum of the inductances 12 and 14, CGS=the gate/source capacity of the transistor, LDD=the sum of the inductances 22 and 24, and CD=the sum of the drain/source capacities of the transistor and of the capacitor 26.

For each cell, equalisation of the phase speeds requires the products LGG.GCS and LDD.CD to be substantially equivalent in the first approximation.

In practice, the field-effect transistors have a gate/source capacity which is far higher than their drain/source capacity. For example, the field-effect transistors which are used in the distributed amplifier which is described with reference to FIG. 2 are of the GaAs type.

In practice, the transistor has a gate/source capacity of approximately 82 fF, and a drain/source capacity of approximately 27 fF.

In order to satisfy the aforementioned two conditions, it is then chosen to make the value of the capacitor 26 vary from one cell to the next, in a manner which increases towards the output of the amplifier.

The applicant has obtained impedance adaptation of 125 ohms/50 ohms by means of a distributed amplifier with four cells, the component elements of which have the following values, taking into account the many parasites which are inherent in the components (it will be appreciated that other configurations with other values can also be appropriate for the invention):

drain polarisation voltage POD=+5 V gate polarisation voltage POG=−0.3 V inductors 12-1 to 12-4 and 14-1 to 14-4 equivalent respectively to 0.48 nH; 0.36 nH; 0.24 nH; 0.12 nH capacitors 10-1 to 10-4=10.3 fF inductors 22-1 and 24-1=0.55 nH capacitor 20-1=27 fF capacitor 26-1=70 fF.

Persons skilled in the art will find that for this first cell A1, the aforementioned equations are substantially obtained (susceptibility of variation according to the parasites).

As far as the cell A2 is concerned, the values of the drain filtering elements are as follows:

inductors 22-2 and 24-2=0.33 nH capacitor 20-2=33 fF capacitor 26-2=94 fF.

As far as the cell A3 is concerned, the values of the drain filtering elements are as follows:

inductors 22-3 and 24-3=0.22 nH capacitor 20-3=33 fF capacitor 26-3=94 fF.

Finally, for the cell A4, the values of the drain filtering elements are as follows:

inductors 22-4 and 24-4=0.136 nH capacitor 20-4=27 fF capacitor 26-4=70 fF.

Persons skilled in the art will find that for each of the cells A1 to A4, the aforementioned equations are substantially obtained.

In addition, they will find that the characteristic impedance of the drain line of each cell decreases relative to that of the preceding cell, according to the following law:

$ZDr = Zcd\,(nce/r)^x$, in which:

nce=number of cells (in this case nce=4), and r=row in the cell,

ZDr is the characteristic impedance of the drain line of the cell CE in row r,

Zcd=impedance of the output load (in this case * 50 ohms), real $x=0<x<1$.

For example, with x=0.5, the characteristic impedance of the drain line of the cell A1 is equivalent to 100Ω and the characteristic impedance of the drain line of the cell A4 is equivalent to 50Ω.

The progression of the impedances of the gate line of the cells can also comply with the following formula:

$$ZGr = Zgd((nce-r)/nce)^y,$$

in which Zgd is the input impedance (in this case approximately 125 ohms), and y is approximately 0.5.

It will be noted that it is the values of the inductors 22 and 24, as well as those of the capacitor 26, which are modified in real terms from one cell to the next, in order to obtain the selected impedance adaptation.

At the output S of the amplifier, the direct voltage of the drain line must be eliminated. For this purpose, use is made for example of a capacitor CB, which is disposed between the end 24-4 of the drain line and the output S of the amplifier. For example, the capacitor CS has a capacitive value which is as large as possible, of approximately a few nF, or more if possible.

In order to avoid being limited towards the low frequencies, the polarisation of the distributed amplifier has saturable loads. Thus, the means of polarisation of the common drain line comprise a plurality of auxiliary field-effect transistors, which function with a saturable load. The respective sources of the auxiliary transistors are connected from a distributive point of view to the common drain line, and the respective drains of the auxiliary transistors receive in series the polarisation voltage POD.

A distributed amplifier of this type with saturable loads is described in document FR-A-2 727 585, the description of which is an integral part of the present application, for all useful purposes.

The applicant has also set out to solve the problem of providing this interface device with means which can eliminate the detrimental effects which are created by the parasitic capacitor CPA.

According to the invention, with reference to FIG. 1, there is applied to the photodiode stage EPH, a stage EBO of the bootstrap type, which comprises a transistor TI1 which is mounted in a common drain, in order, at the resonance frequency, to eliminate the detrimental effects of the parasitic capacitor of the photodiode.

In practice, the photodiode stage EPH is integrated on a microelectric component IC1. The bootstrap stage EBO and the distributed amplifier ADL are integrated on another microelectric component IC2. The components IC1 and IC2 are connected to one another by a connection LI1, which connects the terminal BK to one of the armatures of the capacitor CBO, and a connection LI2 which connects the terminal BA to the gate GI1.

Up to a limit frequency which is determined by the parasitic elements of the assembly, the transistor TI1 acts as a unit gain amplifier, which brings to the input of the current source the same phase and modulus voltage as at its output, thus making it possible to apply to the circuit formed by the capacitor CPA and the resistor RPA a voltage which is substantially zero. Beyond this limit frequency, more complex phenomena occur, giving rise to resonance, in particular between the parasitic capacitor of the photodiode and the inductors which are equivalent to the wiring and connection elements (for example the connections LI1 and LI2). The assembly can still function, but the further the distance from the limit frequency, the more its practical functioning becomes problematic.

For example, if a photodiode with a wide reception surface (diameter of 160 $\mu$m) is taken into consideration, with a parasitic capacity of more than 1pF, the limit frequency is approximately 6 GHz, whereas the cutoff frequency, when the photodiode is connected directly to 50$\Omega$, is approximately 2 GHz. For photodiodes with a very low parasitic capacity (<0.1 pF), the bootstrap assembly loses its advantage, at least when the present connection wiring technique is used (LI1 and LI2).

In practice, the source SI1 of the transistor TI1 is connected to the terminal BK of the current source SC, via a circuit which comprises a line LBO and a capacitor CBO.

The stage EBO is completed by a polarisation circuit, which can supply a polarisation voltage for the drain of the transistor TI1. This polarisation voltage POD1 is applied directly to the drain DI1 of the transistor TI1. Very advantageously, in order to prevent the transistor TI1 from oscillating spontaneously, a stability resistor RD1 is provided, one terminal of which is connected to earth, and the other terminal of which is connected to the polarisation circuit which provides the voltage POD1. A decoupling capacitor CDD1 is interposed between the drain DI1 and the resistor RD1.

The gate GI1 of the transistor TI1 is connected to the terminal BA of the current source SC. If required, the polarisation circuit of the gate applies the direct polarisation voltage POG1 via the resistor RP2.

For example, the elementary value of the capacitors CDP1, CP2, CDD1 is 5 pF internally on the chip, and a few $\mu$F externally.

The ohmic values of the resistors RP1 and RP2 are 100$\Omega$.

The ohmic value of the stability resistor RD1 is for example 5$\Omega$.

The stage EBO is completed by an inductor L1, which has one terminal which is earthed, and another terminal which is connected to the source SI1 of the transistor TI1. The value of the inductor L1 is approximately 4 nH. A resistor R60 of approximately 60$\Omega$ for example is placed in parallel on the inductor L1, with one terminal which is earthed, and another terminal which is connected to the source SI1.

The applicant has found that connections LI1, LI2 of a length of approximately 200 to 400 $\mu$m have inductive properties which are determining, in relation to resonance phenomena which limit the frequency of validity of the assembly. Replacement of the connection wires LI1 and LI2 by a direct connection (of the flip chip type or the like) would make it possible to increase the limits, even for photodiodes with a low parasitic capacity.

In addition, in this case, the capacitor CBO advantageously provides the decoupling of the continuous signal which is used for polarisation of the photodiode of the ultrahigh frequency signal to be processed. The capacitor CBO has a value of approximately 2 pF.

In comparison with a complete commercially available optical connection, comprising a 45 ohm resistor at the input of a an emitter diode, and a 50 ohm resistor in parallel on the output of a receiver photodiode, by means of an emitter which is provided with a low-impedance adapter such as described in document FR-A-2747523, and a receiver which is provided with an interface device according to the invention, on a band ranging from a few KHz (for example 100 KHz) to a few GHz (for example 20 GHz), the applicant has obtained a gain of +6 dB instead of –35 dB for the commercially available connection, and a noise factor of 10 dB instead of 40 dB for the commercially available connection.

What is claimed is:

1. An interface device for use between an optoelectronic sensor and a load, the impedance of which is lower than that of the sensor, the said interface device comprising an impedance adaptation stage, wherein the adaptation stage comprises a distributed amplifier with a broad band of frequencies, the input of which is directly connected to a terminal of the sensor, and constitutes an impedance with an ohmic value which is greater than that of the load, and the output of which is connected to the load, and wherein the interface device additionally comprising a bootstrap which comprises a field-effect transistor mounted in a common drain, the gate of which is connected to one terminal of the sensor, and the source of which is connected to the other terminal of the sensor, via a capacitor with a selected value, which makes it possible to reduce the noise factor of an optical connection which uses the said sensor, whilst maintaining a high, flat level of gain in a very broad frequency band ranging from a few kHz to a few GHz, whereas the bootstrap can compensate for the undesirable effects of the parasitic capacitor of the sensor.

2. The device according to claim 1, wherein the distributed amplifier comprises a plurality of amplifier cells, each of which is mounted between a gate line and a drain line, each cell comprising an active circuit which has at least one field-effect transistor mounted in a common source, and passive elements which constitute sections of the gate line and the drain line, one of the ends of the gate line being connected directly to one of the terminals of the sensor, and one of the ends of the drain line being connected to the load.

3. The device according to claim 2, wherein the values of the passive elements which are used to constitute the sections of the drain line and/or of the gate line are selected in an appropriate manner, such that the characteristic impedance of each cell is smaller than that of the preceding cell, and in accordance with a selected law, in order to bring the characteristic impedance of the drain line progressively to a selected value which permits high-impedance adaptation between the optoelectronic sensor and the load.

4. The device according to claim 2, wherein the polarisation of the distributed amplifier has saturable loads.

5. The device according to claim 1, wherein the input impedance of the distributed amplifier has an ohmic value of approximately 125 ohms.

6. The device according to claim 1, wherein the load has an ohmic value of 50 ohms.

7. An optoelectronic receiver, comprising an interface device provided between an optoelectronic sensor and a load, the impedance of which is lower than that of the sensor, the said interface device comprising an impedance adaptation stage, wherein the adaptation stage comprises a distributed amplifier with a broad band of frequencies, the input of which is directly connected to a terminal of the sensor, and constitutes an impeder with an ohmic value which is greater than that of the load, and the output of which is connected to the load, and wherein the interface device additionally comprising a bootstrap which comprises a field-effect transistor mounted in a common drain, the gate of which is connected to one terminal of the sensor, and the source of which is connected to the other terminal of the sensor, via a capacitor with a selected value, which makes it possible to reduce the noise factor of an optical connection which uses the said sensor, whilst maintaining a high, flat level of gain in a very broad frequency band ranging from a few kHz to a few GHz, whereas the bootstrap can compensate for the undesirable effects of the parasitic capacitor of the sensor.

* * * * *